United States Patent
Teng

(10) Patent No.: US 6,745,693 B2
(45) Date of Patent: Jun. 8, 2004

(54) VARIABLE DATA LITHOGRAPHIC PRINTING DEVICE AND METHOD

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 0 days.

(21) Appl. No.: 10/441,791

(22) Filed: May 19, 2003

(65) Prior Publication Data

US 2003/0226463 A1 Dec. 11, 2003

Related U.S. Application Data

(62) Division of application No. 10/162,345, filed on Jun. 4, 2002, now Pat. No. 6,566,039.

(51) Int. Cl.⁷ ............................. B41M 5/00; B41N 3/00; B41C 1/10
(52) U.S. Cl. .................. 101/463.1; 101/464; 101/465; 101/466; 101/467; 101/450.1; 101/451; 101/460; 430/302; 430/303; 430/329
(58) Field of Search .................. 101/450.1, 451, 101/460, 463.1, 464, 465, 466, 467; 430/302, 303, 329, 49

(56) References Cited

U.S. PATENT DOCUMENTS

| | | | |
|---|---|---|---|
| 5,235,454 A | 8/1993 | Iwasaki | 359/198 |
| 5,538,825 A * | 7/1996 | Pundsack et al. | 430/49 |
| 5,652,076 A * | 7/1997 | Kato et al. | 430/49 |
| 5,713,287 A | 2/1998 | Gelbart | 101/467 |
| 5,735,983 A * | 4/1998 | Goss et al. | 156/244.11 |
| 5,893,328 A * | 4/1999 | Ghosh et al. | 101/467 |
| 5,928,823 A * | 7/1999 | Kato | 430/49 |
| 5,981,151 A * | 11/1999 | Leenders et al. | 430/302 |
| 5,985,515 A * | 11/1999 | Van Rompuy et al. | 430/302 |
| 6,187,380 B1 * | 2/2001 | Hallman et al. | 101/463.1 |
| 6,232,038 B1 | 5/2001 | Takasaki et al. | 430/281.1 |
| 6,242,156 B1 | 6/2001 | Teng | 430/271.1 |
| 6,298,780 B1 | 10/2001 | Ben-Horin et al. | 101/478 |
| 6,410,208 B1 * | 6/2002 | Teng | 430/302 |
| 6,482,571 B1 | 11/2002 | Teng | 430/302 |
| 6,541,183 B2 | 4/2003 | Teng | 430/303 |
| 6,548,222 B2 | 4/2003 | Teng | 430/278.1 |

* cited by examiner

Primary Examiner—Eugene H. Eickholt

(57) ABSTRACT

A variable data lithographic printing device comprises surrounding a printing cylinder a photosensitive layer coater, an exposure source, optionally a developer, an inking applicator, optionally a transfer system, and optionally an eraser. During printing operation, each surface areas of the rotating cylinder continuously undergo the cycle of coating, imagewise exposure, optionally developing, inking, printing of inked images to the receiving medium, and optionally erasing processes. The developing means can be omitted if an ink and/or fountain solution developable photosensitive layer is used. In an alternative design, the cylinder is replaced with a continuous supply of a ribbon with lithographic substrate surface. In another alternative design, the cylinder and the coater are replaced with a continuous supply of a pre-sensitized ribbon comprising on a substrate a photosensitive layer.

22 Claims, 4 Drawing Sheets

VARIABLE DATA LITHOGRAPHIC PRINTING DEVICE AND METHOD

RELATED PATENT APPLICATIONS

This application is a division of U.S. patent application Ser. No. 10/162,345 filed Jun. 4, 2002, now U.S. Pat. No. 6,566,039.

FIELD OF THE INVENTION

This invention relates to variable data printing. More specifically, it relates to variable data lithographic printing device and process.

BACKGROUND OF THE INVENTION

Lithographic printing surface generally consists of ink-receptive areas (image areas) and ink-repelling areas (non-image areas). During printing operation, an ink is preferentially received in the image areas, not in the non-image areas, and then transferred to the surface of a material upon which the image is to be produced.

Lithographic printing can be further divided into two general types: wet lithographic printing and waterless lithographic printing. In wet lithographic printing members, the ink-receptive areas consist of oleophilic materials and the ink-repelling areas consist of hydrophilic materials; fountain solution (consisting of primarily water) is required to continuously dampen the hydrophilic materials during printing operation to make the non-image areas oleophobic. In waterless lithographic printing members, the ink-receptive areas consist of oleophilic materials and the ink-repelling areas consist of oleophobic materials; no dampening with fountain solution is required.

At the present time, lithographic printing is generally performed on a lithographic printing press. The lithographic printing member can be a typical lithographic printing plate mounted on the plate cylinder. The plate can be imaged and processed before or after mounted on press. Examples of such a printing process are described in U.S. Pat. Nos. 5,700,619, 5,466,557, 5,491,045 and 5,955,238 (for off-press imaging and process), and U.S. Pat. Nos. 5,258,263, 5,395,734, 5,516,620, 6,030,750, 6,014,929, 6,071,675, and 6,242,156 (for on-press development).

Alternatively, the lithographic printing member can be formed on press by coating a photosensitive layer onto a plate cylinder surface or onto a plate substrate mounted on a plate cylinder. The on-press formed printing member can be imagewise exposed and processed on press before lithographic printing. After the completion of a printing operation, the hardened imaging layer on the plate cylinder can be cleaned off to allow reuse of the cylinder or substrate surface for preparing another printing member. Such a printing system is commonly called plateless press. Examples of such a plateless press are described in U.S. Pat. Nos. 5,713,287 and 6,298,780.

While lithographic printing process as described above has played a major role in printing and publishing industrial for decades, the application of lithographic printing so far is limited to making multiple copies (usually a few hundreds to a few millions copies).

In variable data printing application wherein each copy printed has different imaging, inkjet printing and electrophotographic (or called Xerox) laser printing are the most widely used methods, as evidenced by widely used desktop inkjet printer and laser printer. Other printing methods, such as thermal paper and thermal dye transfer, also play an important role, as evidenced by some facsimile printers. While these current variable data printing methods are very useful, the printing quality by these methods is inferior to that by lithographic printing in resolution, color density and imaging stability. For example, material printed with inkjet printer has limited resolution and imaging stability; material printed with thermal printer has limited color density and imaging stability; and material printed with Xerox laser printer has limited resolution and toner-to-medium adhesion.

It would be desirable if a variable data printing device can be designed based on lithographic printing principle. This would allow improved resolution, color density, and imaging stability.

SUMMARY OF THE INVENTION

It is an object of this invention to provide a lithographic printing device suitable for variable data printing.

It is another object of this invention to provide a lithographic printing device and process which allow continuous photosensitive layer coating, imagewise exposure, development, formation of inked imaging, transfer of the inked imaging to a receiving surface, and recovering of the substrate surface during printing process.

It is another object of this invention to provide a lithographic printing device and process which allow continuous formation or supply of pre-sensitized lithographic printing surface, imagewise exposure, development, formation of inked imaging, transfer of the inked imaging to a receiving surface during printing process.

Further objects, features and advantages of the present invention will become apparent from the detailed description of the preferred embodiments.

According to the present invention, there has been provided a variable data lithographic printing device comprising:

(a) a printing cylinder;

(b) a coating means for depositing a photosensitive layer on the cylinder surface, wherein said photosensitive layer is soluble or dispersible in ink and/or fountain solution, capable of hardening upon exposure to an actinic radiation, and exhibits an affinity or aversion substantially opposite to the affinity or aversion of said cylinder surface to at least one printing liquid selected from the group consisting of ink and an abhesive fluid for ink;

(c) an exposure means for providing the actinic radiation to the cylinder surface according to digital imaging information;

(d) an inking means for applying ink or both fountain solution and ink to the cylinder surface; and (e) an erasing means for removing the remaining photosensitive layer and leftover ink to recover the cylinder surface;

(f) wherein the means (b) to (e) are mounted proximate the cylinder surface and sequentially arranged along the cylinder surface in the rotating direction of the cylinder; and each means of (b) to (e) completes its designed function (coating, imaging, inking, or erasing) to the cylinder surface areas in the designed printing width which pass by said means in each single pass during printing operation.

According to another aspect of the present invention, there has been provided a method of variable data lithographic printing, comprising:

(a) providing a lithographic printing device as described above;

(b) continuously depositing the photosensitive layer on the cylinder surface;

(c) continuously exposing the plate with an actinic radiation to cause hardening of the photosensitive layer in the exposed areas according to digital imaging information;

(d) continuously applying ink or both fountain solution and ink to the cylinder surface to remove the non-hardened areas of the photosensitive layer and to form inked imaging on the cylinder surface;

(e) continuously lithographically printing images from said cylinder surface to a receiving surface; and (f) continuously removing the hardened photosensitive layer and leftover ink to bare the cylinder surface.

The above printing systems can be designed in a way so that the hardened photosensitive layer is capable of transferring with ink to the receiving surface, or the hardened photosensitive layer and leftover ink are capable of dissolving or dispersing into the photosensitive layer coating fluid from the coating means. In either system, the erasing means can be omitted.

For the above variable data lithographic printing device of this invention, the printing cylinder can be replaced with a substrate ribbon supply means for passing a ribbon having a lithographic substrate surface through one or more rollers with one end unwinding from a roll of unused ribbon and the other end winding up to a roll of used ribbon. The erasing means is not needed in such a system. The coating means, exposure means, and inking means are mounted proximate the passage of the ribbon and sequentially arranged along the moving direction of the ribbon.

For the above variable data lithographic printing device of this invention, the printing cylinder and the coating means can be replaced with a pre-sensitized lithographic ribbon supply means for passing a pre-sensitized lithographic ribbon through one or more rollers with one end unwinding from a roll of unused ribbon and the other end winding up to a roll of used ribbon, wherein the pre-sensitized ribbon comprises on a substrate an ink and/or fountain solution developable photosensitive layer. The erasing means is not needed. The exposure means and inking means are mounted proximate the passage of the ribbon and sequentially arranged along the moving direction of the ribbon.

For all the above devices and processes of this invention, a developing means can be added between the exposure means and inking means so that a conventional photosensitive layer that is not developable with ink and/or fountain solution can be used.

The printing device of this invention can be a typical printer wherein the inked imaging is transferred to a sheet-like receiving medium that passes through the printing device; a transfer means can be equipped after the inking means to feed the receiving medium through the printing device while pressing the receiving medium against the inked cylinder or ribbon surface. Alternatively, the printing device of this invention can be a printing wheel wherein the printing cylinder or printing device moves against the receiving surface of a stationary object during printing operation.

The current invention can be used to design various variable data printers such as desktop printer, portable printer, photoprinter, photocopier, facsimile printer, cashier receipt printer, and variable data printing wheels. The variable data printing wheels are suitable for printing variable imaging on various fixed or hard-to-feed objects such as floor, wall, road, box, a page in a book, truck, clothes, cardboard, skin, and billboard.

DETAILED DESCRIPTION OF THE PREFERRED EMBODIMENTS

Figure 1:
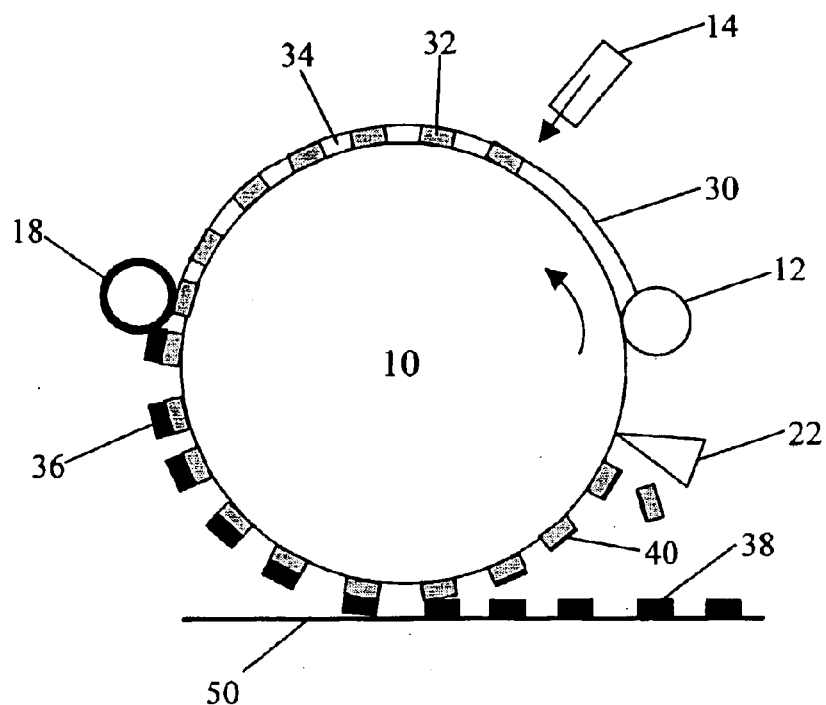
FIG. 1 is a diagrammatic cross-sectional view of a lithographic printing device of the invention utilizing a cylinder with lithographic substrate surface and an ink and/or fountain solution developable photosensitive coating.

The lithographic printing device utilizing a cylinder to form the lithographic substrate surface and an ink and/or fountain solution developable photosensitive layer is illustrated in FIG. 1. The lithographic printing device comprises (i) a cylinder 10 having an external substrate surface; (ii) a coating means 12, (iii) an exposure means 14, (iv) an inking means 18 capable of delivering ink or both fountain solution and ink, and (v) an erasing means 22 capable of recovering the substrate surface. The means 12, 14, 18, and 22 are mounted proximate the cylinder surface and sequentially arranged along the cylinder surface in the rotating direction of the cylinder; and each means of 12, 14, 18, and 22 completes its designed function (coating, exposure, inking, or erasing) to the cylinder surface areas at the designed printing width which pass by that means in each single pass during printing operation. Between the coating means and the erasing means, the cylinder should have an open surface area available for transferring the inked imaging to the receiving surface. A transfer means, such as a roller transporting the medium while pressing against the cylinder, may be equipped. A photosensitive layer suitable for use in such a device must be soluble or dispersible in and quickly developable with ink and/or fountain solution.

All the figures in this patent are high level illustrations. Each means can be a single element or a combination of multiple elements, as needed for performing the desired function. For example, the inking means can be a single ink roller, or can be a combination of three ink rollers and two fountain solution rollers. In all the figures, the photosensitive layer is illustrated as ink-receptive. However, the photosensitive layer can also be ink-repelling with the substrate being ink-receptive.

During printing operation as also illustrated in FIG. 1, the coating means 12 applies coating fluid 30 to the surface of the cylinder 10. The exposure means 14 exposes the photosensitive layer with an actinic radiation according to digital imaging information to form hardened areas 32 (exposed areas) and non-hardened areas 34 (non-exposed areas). The inking means 18 applies ink (for waterless lithographic printing surface) or both fountain solution and ink (for wet lithographic printing surface) to remove the non-hardened areas of the photosensitive layer and to form inked imaging 36. The inked imaging 36 is transferred to the surface of the receiving object 50 to form printed imaging 38. The cured photosensitive layer and any leftover ink are cleaned off with the erasing means 22. The erasing means may use a dry process such as cleaning with a blade or brush or a wet process such as wiping with a ribbon soaked with solvent, and a collecting means may be equipped to collect the removed photosensitive layer and leftover ink as well as any waste solvent. For waterless lithographic printing surface, the inking means 18 applies only ink. For wet lithographic printing surface, the inking means 18 applies both fountain solution and ink, preferably with fountain solution being applied first followed by ink or with both fountain solution and ink being applied together as emulsion; alternatively, a single fluid ink suitable for wet lithographic printing surface can be used.

Figure 2:
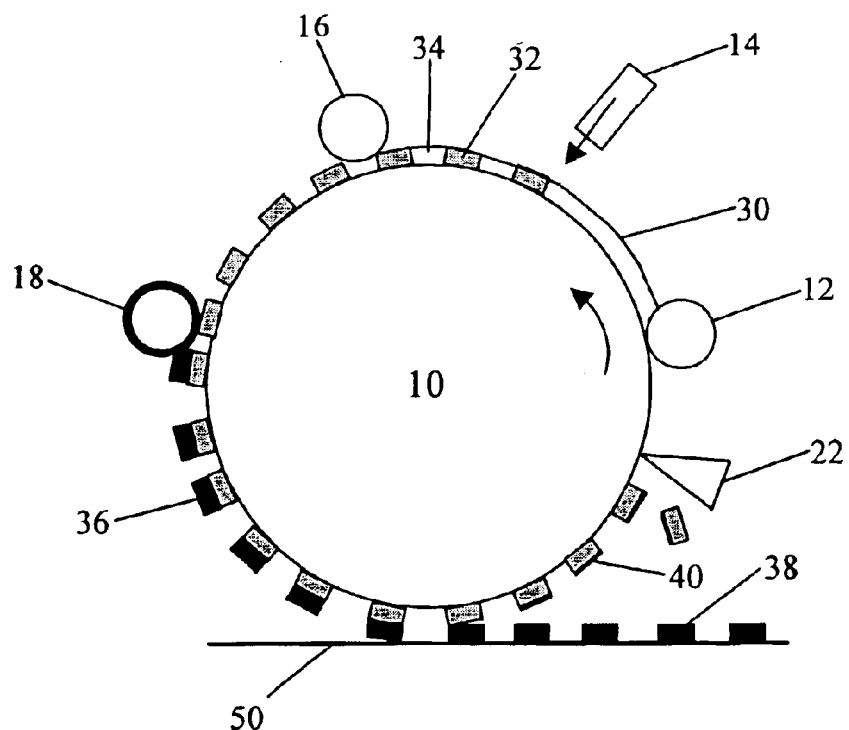
FIG. 2 is a diagrammatic cross-sectional view of a lithographic printing device of the invention wherein the non-hardened areas of the photosensitive layer are removed by the developing means.

A developing means may be installed between the exposure means and the inking means, as illustrated in FIG. 2. A lithographic printing device comprising a developing means allows the utilization of a photosensitive layer that is not developable with ink and/or fountain solution. Such a lithographic printing device comprises (i) a cylinder 10 having an external substrate surface; (ii) a coating means 12, (iii) an exposure means 14, (iv) a developing means 16, (v) an inking means 18 capable of delivering ink or both fountain solution and ink, and (vi) an erasing means 22 capable of recovering the substrate surface. The means 12, 14, 16, 18, and 22 are mounted proximate the cylinder surface and sequentially arranged along the cylinder surface in the rotating direction of the cylinder; and each means of 12, 14, 16, 18, and 22 completes its designed function (coating, exposure, developing, inking, or erasing) to the cylinder surface areas at the designed printing width which pass by that means in each single pass during printing operation. A transfer means, such as a roller transporting the medium while pressing against the cylinder, may be equipped. During printing operation, the coating means 12 applies coating fluid 30 to the surface of the cylinder 10. The exposure means 14 exposes the photosensitive layer with an actinic radiation according to digital imaging information to form hardened areas 32 (exposed areas) and non-hardened areas 34 (non-exposed areas). The areas 34 not exposed with the actinic radiation are removed by developing means 16. The developed cylinder surface is applied with ink or both fountain solution and ink with the inking means 18 to form inked imaging. The inked imaging 36 is transferred to the surface of the receiving object 50 to form printed imaging 38. The hardened photosensitive layer and leftover ink are cleaned off with the erasing means 22.

It is a key requirement of this invention that each means surrounding the printing cylinder, such as 12, 14, 16, 18, 20 and 22, completes its designed function to the cylinder surface areas in the designed printing width which pass by that means in each single pass during printing operation. In other words, whenever any surface areas of the cylinder in the designed printing width pass by a means, that means immediately carries out and completes its designed function (such as coating, exposure, developing, inking, printing, or erasing) to these areas. All the surface areas of the cylinder at the designed printing width complete a full cycle of functions (such as coating, exposure, developing, inking, printing, and erasing) for each rotation during regular printing operation.

The term designed printing width means the width of the imaging pattern (including inked and non-inked areas) to be printed from the cylinder to the receiving object. The designed printing width can be the full length of the cylinder, or can be a specific width (which is less than the full length of the cylinder) along the axis direction of the cylinder. A printing device can have a fixed printing width, or the printing width can be adjusted for different printing job. Usually all the means effectively cover the same width which is the designed printing width. However, certain means, such as exposure means and inking means, may cover narrower areas than other means; and certain means, such as the erasing means, may cover wider areas than other means. The narrower covering width for certain means is desirable when the width of a printing job is narrower than the maximum or typical printing width of the printing device and when it is more feasible to only adjust the covering width of some of the means.

While each means is utilized to perform a specific function, the specific design of that means is not limited. In this invention, any design that can perform the specific function of a means can be used for that means. For example, the coating means can be a roller coater, slot coater, or a spray coater; the dampening means can apply fountain solution by spraying or by using a roller; and the erasing means can recover the substrate surface by removing the photosensitive layer and the leftover ink with a blade or by wiping with a cloth or ribbon soaked with a solvent or solution.

Usually, all the means performs their functions during the whole printing process, even when printing a large continuous non-inked area (such as a third of a page). Alternatively, for a large area where the function performed by certain means is not necessary, the means may be turned off or disengaged from the cylinder surface, preferably by an automatic or digital means. For example, if a third of a page of printing area is non-inked area, the inking means may be disengaged from the cylinder surface or the coating means may pause coating onto the cylinder surface corresponding to this area. The receiving surface may be disengaged from the printing cylinder to let the cylinder and all the means operate in idle during the startup of a printing job (to tune up the printing process) or when there is a large continuous non-inked areas (such as half a page). For multicolor printing machine equipped with two or more printing cylinders as well as other means around the cylinders, one (or more) of the printing cylinders may be disengaged from the receiving surface if that color is not used in the particular printing job or in a large continuous area.

The cylinder rotating speed is usually constant during one printing operation. However, it may be automatically adjusted according to the imaging density. It may rotate faster for lower imaging density and slower for higher imaging density.

The printing cylinder can have any dimensions suitable for carrying out the lithographic printing process of this invention. The printing cylinder preferably has a diameter of from 0.2 to 1000 cm, more preferably from 1 to 100 cm, and most preferably from 2 to 50 cm. For desktop printers, the printing cylinder diameter is relatively smaller, preferably ranging from 0.5 to 50 cm, and more preferably from 1 to 20 cm. For portable printers, the printing cylinder diameter can be even smaller, preferably ranging from 0.2 to 20 cm, and more preferably from 0.5 to 10 cm. For printing presses, the printing cylinder diameter is relatively larger, preferably ranging from 10 to 200 cm, and more preferably from 20 to 100 cm. For printing wheels, the printing cylinder diameter can be similar to that for a desktop printer or similar to that for a printing press, or can be even larger. The printing cylinder in a printing wheel device can be relatively small in diameter so that it can easily reach out to print various surfaces, such as a wall. The whole printing wheel device can be relatively small so that it can be carried by hand to perform the printing job on a surface, such as a wall or floor. Alternatively, the printing cylinder in a printing wheel device can be a large wheel (such as from 10 to 1000 cm in diameter) on a vehicle and is driven by the vehicle during printing operation (such as printing a floor or a road).

The cylinder surface can be made of any material that is suitable for the substrate surface for lithographic printing. The cylinder surface can be an integrated part of the cylinder, or can be the surface of a plate or sleeve slid onto the cylinder. The cylinder surface can be made of, for example, a metal, a polymer, glass, or a ceramic. A surface coating or surface treatment may be applied to the material on the cylinder surface to achieve desired surface properties. The printing cylinder preferably has a seamless surface. The cylinder surface can be smooth or microscopically roughened.

Suitable hydrophilic materials for the cylinder surface include, for example, anodized aluminum, chrome, nickel, steel, glass, and ceramics (such as alumina and zirconia). A preferred hydrophilic cylinder surface is made of a metal or metal alloy, including steel and aluminum, which has been anodized and deposited with a hydrophilic barrier layer. The metal or metal alloy may have smooth or grained surface. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer to form a durable hydrophilic layer. A second preferred hydrophilic cylinder surface is a ceramic or glass that has smooth or roughened microscopic surface. A preferred oleophilic cylinder surface comprises an oleophilic polymeric material.

The photosensitive layer of the current invention can be any material capable of hardening upon exposure to an actinic radiation in ultraviolet, visible, or infrared region (about 200 to 1500 nm in wavelength). Hardening means becoming insoluble in a suitable developer. For ink and/or fountain solution developable photosensitive layer, hardening means becoming insoluble in ink and/or fountain solution. Suitable photosensitive materials include, for example, photopolymerizable compositions, silver halide emulsions, and diazonium salts. For infrared sensitive photosensitive materials, infrared absorbing dye or pigment can be added. Various additives may be added, such as surfactant, plasticizer, viscosity reducer, stabilizer, dye, or pigment. The photosensitive layer may be colorless or may have the same color of the ink by adding a suitable dye or pigment.

Preferred photosensitive materials are free radical or cationic polymerizable compositions. The photosensitive layer is preferably deposited from a liquid photosensitive coating with or without addition of solvent. Here the term solvent includes organic solvent and water. The photosensitive layer preferably has a coverage of 0.02 to 2.0 $g/m^2$, more preferably 0.1 to 1.5 $g/m^2$, and most preferably 0.2 to 1.0 $g/m^2$.

The photosensitive layer can comprise a polymerizable monomer and a photoinitiator. A sensitizer (such as an infrared, visible, or ultraviolet light absorbing dye) may be added to allow sensitivity to a certain radiation (such as an infrared, visible, or ultraviolet light). The term monomer includes both monomer and oligomer capable of polymerization.

A preferred photosensitive layer comprises a polymerizable ethylenically unsaturated monomer and a free-radical photoinitiator; a second preferred photosensitive layer comprises a vinyl ether or epoxy monomer and a cationic photoinitiator. Polymeric binder, sensitizing dye, and/or various other additives may be added. Here the photosensitive layer can be sensitized to ultraviolet, visible, or infrared radiation.

A preferred infrared sensitive photosensitive layer comprises a polymerizable ethylenically unsaturated monomer, a free-radical initiator, and an infrared absorbing dye; a second preferred infrared sensitive photosensitive layer comprises a vinyl ether or epoxy monomer, a cationic initiator, and an infrared absorbing dye. Polymeric binder, and/or various other additives may be added.

Semisolid photosensitive materials as described in U.S. Pat. application Ser. No. 09/873,598 and thermosensitive materials as described in U.S. Pat. application Ser. Nos. 09/656,052, 09/699,784, 09/952,933, and 10/023,342 can be used for the photosensitive layer of this invention. The entire disclosures of U.S. Pat. application Ser. Nos. 09/873,598, 09/656,052, 09/699,784, 09/952,933, and 10/023,342 are hereby incorporated by reference.

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

Suitable free-radical initiators include, for example, derivatives of acetophenone (such as 2,2-dimethoxy-2-phenylacetophenone, and 2-methyl-1-[4-(methylthio) phenyl]-2-morpholinopropan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts [such as diaryliodonium hexafluoro antimonate, diaryliodonium triflate, (4-(2-hydroxytetradecyl-oxy)-phenyl)phenyl iodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl)pyridinium hexafluorophosphate, and the onium salts as described in U.S. Pat. Nos. 5,955,238, 6,037,098, and 5,629,354]; borate salts [such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076]; haloalkyl substituted s-triazines [such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354]; and titanocene [bis($\eta^9$-2,4-cyclopentadien-1-yl) bis(2,6-difluoro-3-(1H-pyrrol-1-yl) phenyl) titanium]. The initiator is added in the photosensitive layer preferably at 0.1 to 40% by weight of the photosensitive layer, more preferably at 0.4 to 20%, and most preferably at 1 to 10%.

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

Infrared absorbers useful in the infrared sensitive photosensitive layer of this invention include any infrared absorbing dye or pigment effectively absorbing an infrared radiation having a wavelength of 700 to 1,500 nm. It is preferable that the dye or pigment has an absorption maximum between the wavelengths of 750 and 1,200 nm. Various infrared absorbing dyes or pigments are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the infrared sensitive photosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. Examples of useful infrared absorbing pigments include black pigments, metal powder pigments, phthalocyanine pigments, and carbon black. Carbon black is a preferred infrared absorbing pigment. Mixtures of dyes, pigments, or both can also be used. Infrared absorbing dye is preferred over infrared absorbing pigment because the infrared absorbing dye usually has higher absorbing efficiency, gives less visible color, and allows molecular level charge or energy transfer to activate the initiator. The infrared dye or pigment is added preferably at 0.01 to 30% by weight of the infrared sensitive photosensitive layer, more preferably at 0.1 to 20%, and most preferably at 0.5 to 10%.

Suitable polymeric binders for the photosensitive layers of this invention include, for example, polystyrene, (meth) acrylic polymers and copolymers (such as polybutylmethacrylate, polyethylmethacrylate, polymethylmethacrylate, polymethylacrylate, and butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehyde, butadiene/acrylonitrile copolymer, and polyurethane. The polymers may or may not have polymerizable functional groups (such as ethylenic group, epoxy group, or vinyl ether group).

The ink and/or fountain solution developable photosensitive layer of this invention must be capable of hardening upon exposure to an actinic radiation, and soluble or dispersible in ink and/or fountain solution and can be developed off quickly with ink and/or fountain solution. Various ink and/or fountain solution developable photosensitive layers have been disclosed in the patent literature such as U.S. Pat. Nos. 5,516,620, 5,677,108, 5,776,654, 5,811,220, 5,997,993, 6,014,929, 6,071,675 and 6,027,857, and can be used in this invention. Because the photosensitive layer is in situ coated and there is no handling issue, liquid or semisolid photosensitive compositions can be used. Higher amount of liquid monomer can be used in the photosensitive layer.

For ink and/or fountain solution developable photosensitive layer, various surfactants may be added into the photosensitive layer to allow or enhance the ink and/or fountain solution developability. Both polymeric and small molecule surfactants can be used. However, it is preferred that the surfactant has low or no volatility so that it will not evaporate from the photosensitive layer. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol; ethoxylated or propoxylated acrylate oligomers; and polyethoxylated alkylphenols and polyethoxylated fatty alcohols. The nonionic surfactant is preferably added at 0.1 to 30% by weight of the photosensitive layer, more preferably 0.5 to 20%, and most preferably 1 to 10%.

The photosensitive layer is deposited from a coating material by the coating means. The coating material is preferably a liquid or semisolid material capable of forming a thin film on the cylinder surface by a suitable coating means. The coating means can be in any form. Examples of suitable coating means include roller coater, slot coater, sponge coater, and spray coater. The coating material is preferably stored in a reservoir, and the coating means continuously transfers the coating material to the cylinder surface at a certain rate during printing operation. For example, the coating means can be a roller that is in contact with the coating material reservoir in one rotating angle and with the printing cylinder in another rotating angle; during printing operation, the roller continuously rotates to deliver the coating material to the cylinder surface to form a thin photosensitive layer. The reservoir containing the coating material may be supplied as coating material cartridge. Alternatively the coating material in the reservoir may be refillable. The coating roller and the reservoir may be built as an integrated part, or can be built as separate parts. The integrated coating unit comprising the coating roller and the reservoir containing coating material may be supplied as a coating cartridge.

The coating material is usually coated at room or environmental temperature. Alternatively, the coating material may be heated by a heating means within the coating means to reduce viscosity and allow thinner coating; this allows the use of certain higher viscosity liquid or semisolid, or even solid coating material.

The coating material for forming the photosensitive layer is preferably free of solvent and is preferably a liquid or semisolid material. However, solvent may be added to facilitate the coating process. For photosensitive layer deposited from a coating with solvent, a drying means can be equipped next to the coating means. Examples of suitable drying means include a device providing forced room-temperature or hot air.

The photosensitive material is preferably deposited on the printing cylinder surface as a single layer. However, more than one photosensitive layers deposited from two or more coaters next to each other may be applied. A photo-insensitive overcoat may be applied over the photosensitive layer by an overcoat coater after the photosensitive layer coating means to, for example, reduce oxygen inhibition and improve photospeed. A photo-insensitive interlayer may be applied to the cylinder surface by an interlayer coater before coating the photosensitive layer. For printing device using ink and/or fountain solution developable photosensitive layer, ink and/or fountain solution soluble or dispersible overcoat and interlayer should be used.

The exposure means provides imaging radiation to the photosensitive layer in the areas passing by the exposure means in the designed printing width according to digital imaging information. The radiation is capable of causing hardening of the photosensitive layer. It can be an infrared, visible, or ultraviolet radiation that is actinic to the photosensitive layer. The radiation can be from any source, including a laser, LED, or conventional light source. Laser is a preferred radiation source. Laser diodes are especially useful because of their small sizes and relatively low costs. Preferred visible or ultraviolet light lasers include, for example, frequency-doubled Nd/YAG laser, argon ion laser, violet diode laser, and ultraviolet laser. Preferred infrared lasers are laser diodes emitting around 830 nm or Nd/YAG laser emitting around 1060 nm. The exposure dosage is preferably about 0.001 to about 1000 $mJ/cm^2$, and more preferably about 0.1 to about 500 $mJ/cm^2$, depending on the sensitivity of the photosensitive layer. Exposure dosage should be high enough to give sufficient hardening so that the hardened photosensitive layer can withstand the development and/or inking action, but it should be preferably low enough so that the hardened photosensitive layer is not too hard to be removed by the erasing means. The suitable dosage should depend on the specific photosensitive layer, cylinder surface, developing process, inking process, erasing process, and/or the general design of the printing device.

The exposure means can cover the designed printing width by, for example, scanning back and forth a laser with a rotating mirror along the axis direction of the printing cylinder to expose the cylinder surface passing by according to digital imaging information, or utilizing an array of digitally controlled lasers or LEDs to cover the full printing width. Laser scanners using a rotating mirror for scanning back and forth along the axis direction have been well described in the patents, and can be used for the exposure means of this invention. Examples of such laser scanners are described in U.S. Pat. Nos. 5,235,454, 5,124,830, 5,428,473, and 5,142,404.

The developing means applies a developer liquid to the photosensitive layer to dissolve or disperse and remove the non-hardened areas of the photosensitive layer. The developing means can be in any form. For example, it can be a cloth or ribbon soaked with the developer liquid that wipes over the cylinder surface during printing process. The used cloth or ribbon may be replaced automatically through automatic means during printing operation; for example, the ribbon can be very long with one end unwinding from a roll of clean ribbon and the other end winding up to a roll of dirty ribbon. For printing device using an ink and/or fountain solution developable photosensitive layer, the developing means is not needed.

The inking means applies ink or both fountain solution and ink to the cylinder surface. It is preferably applied through one or more rollers. The inking means preferably has a reservoir of ink or both a reservoir of ink and a reservoir of fountain solution. During printing operation, the roller rotates and transfers the ink or both fountain solution and ink to the cylinder surface. For waterless lithographic printing surface, only ink is used. For wet lithographic printing surface, both fountain solution and ink are used, except for the recently introduced single fluid ink that allows printing on wet lithographic surface without the use of fountain solution. For inking means carrying both fountain solution and ink, usually the fountain solution is applied first followed by the ink. Alternatively, the fountain solution and ink are emulsified by the inking rollers and then transferred as emulsion of fountain solution and ink to the cylinder surface. For photosensitive layer developable with ink or both fountain solution and ink, the inking means removes the photosensitive layer in the non-hardened areas, and then inks up the ink-receptive areas, such as the hardened areas. The ink roller is pressed against the cylinder surface at a suitable pressure. Certain movement of the ink rollers, such as movement along the axial direction, vibration, or shearing against the rotating surface of the printing cylinder may be used to enhance the ink and/or fountain solution development as well as the inking process.

The ink suitable for the lithographic printing device of the present invention is generally an oleophilic, pigmented liquid or semisolid material, and is similar to or the same as the ink used in lithographic printing press; an oleophilic ink forms inked imaging in the oleophilic areas. However, a dyed or colorless ink may be used. A hydrophilic ink may also be used to form inked imaging in the hydrophilic areas. The ink can be non-radiation curable or radiation curable. Non-radiation curable ink has the advantage of lower cost and not requiring curing device. Radiation curable ink allows immediate drying of the ink and better stability on the receiving surface. The radiation can be an ultraviolet, visible, or infrared light, depending on the sensitization of the ink. Ultraviolet curable ink is the preferred radiation curable ink. When a radiation curable ink is used, a lamp may be installed in the printing device facing the just printed receiving surface to cure the printed ink.

For a wet lithographic printing surface utilizing both fountain solution and ink, the photosensitive ink and the photosensitive layer may be formulated to have the same or substantially the same composition. Pigment or dye may be added to the photosensitive layer. This allows minimized cross contamination.

Figure 3:
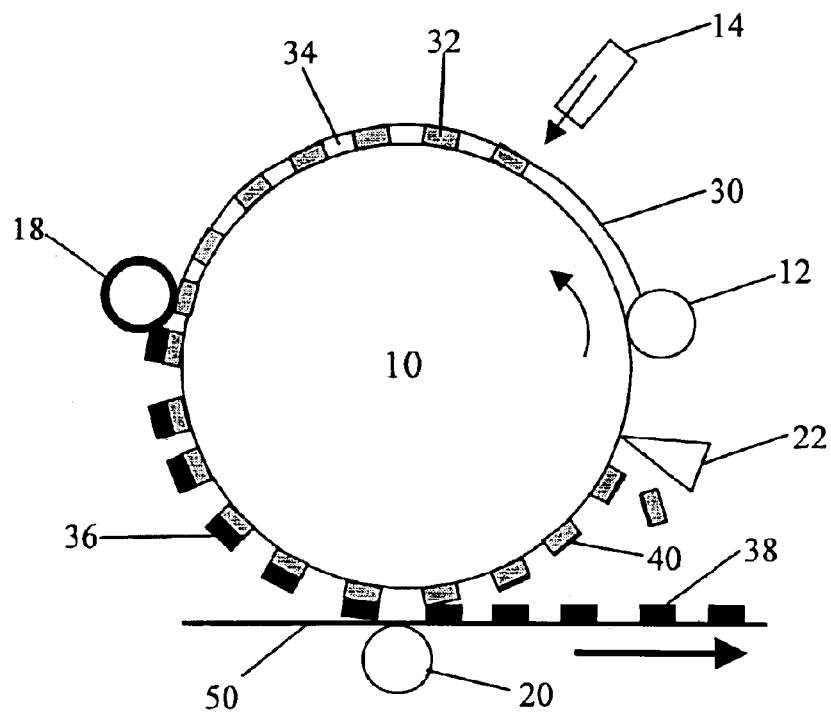
FIG. 3 is a diagrammatic cross-sectional view of a lithographic printing device of the invention wherein the receiving medium passes through the printing device.
Figure 4:
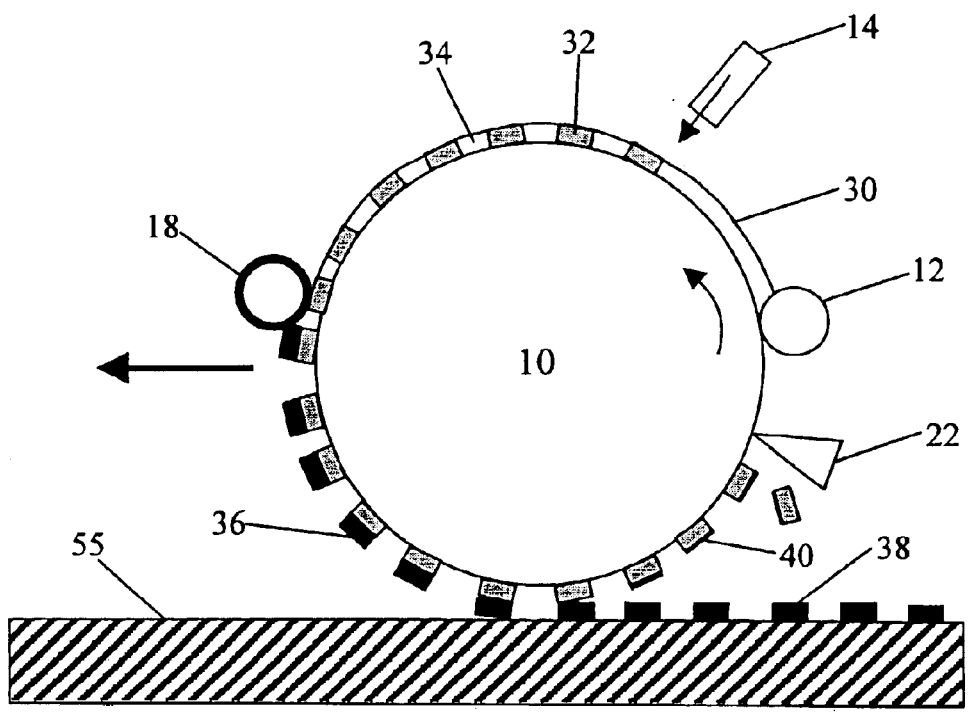
FIG. 4 is a diagrammatic cross-sectional view of a lithographic printing device of the invention wherein the printing cylinder moves against a stationary object to be printed during printing process. Such a device is also called printing wheel.

The printing device of this invention can be a regular printer with the receiving medium passing through the printer, as illustrated in FIG. 3, wherein a transfer means 20 is equipped to pass the receiving medium 50 through the printing device at the moving speed of the cylinder surface while pressing the receiving medium 50 against the inked cylinder surface 36. Alternatively, the printing device of this invention can be a printing wheel, as illustrated in FIG. 4, wherein the printing cylinder 10 or printing device moves against the receiving surface of a stationary object 55 to form inked imaging 38 on the receiving surface. The cylinder should have certain open surface areas that allow direct contact of the inked cylinder surface 36 with the receiving object 55. The printing wheel should move at the moving speed of the cylinder surface. The movement of the printing wheel during printing process may be controlled manually or by an automatically or manually operated mechanical device.

The inked imaging is preferably transferred directly from the printing cylinder to a receiving surface. Alternatively, the inked imaging can be transferred to an intermediate cylinder that transfers the inked imaging to the receiving surface; the intermediate cylinder is equipped with a cleaning means to clean off any leftover ink. For printing device with two or more printing cylinders, two or more printing cylinders may share the same intermediate cylinder to transfer the imaging from these printing cylinders to the receiving surface. Alternatively, a transfer belt or disposable ribbon can be used in place of the intermediate cylinder to transfer the inked imaging to the receiving surface.

The erasing means removes the hardened areas of the photosensitive layer and any leftover ink from the cylinder surface, and prepares the cylinder surface for next cycle of processes starting with coating. Any debris attracted to the cylinder surface during the previous printing cycle, such as dust attracted from the receiving surface, is also removed by the erasing means. The erasing means can be in any form, such as a blade (suitable for a flat substrate surface), or a cloth, ribbon or belt dampened with a cleaning solvent. The used cloth or ribbon may be replaced automatically through automatic means during printing operation; for example, the ribbon can be very long with one end unwinding from a roll of clean ribbon and the other end winding up to a roll of dirty ribbon. The belt may pass through a cleaning solvent that cleans off the belt and allows reuse of the belt. A collecting means such as a vacuum or a box may be equipped next to the blade to collect the removed materials.

Figure 5:
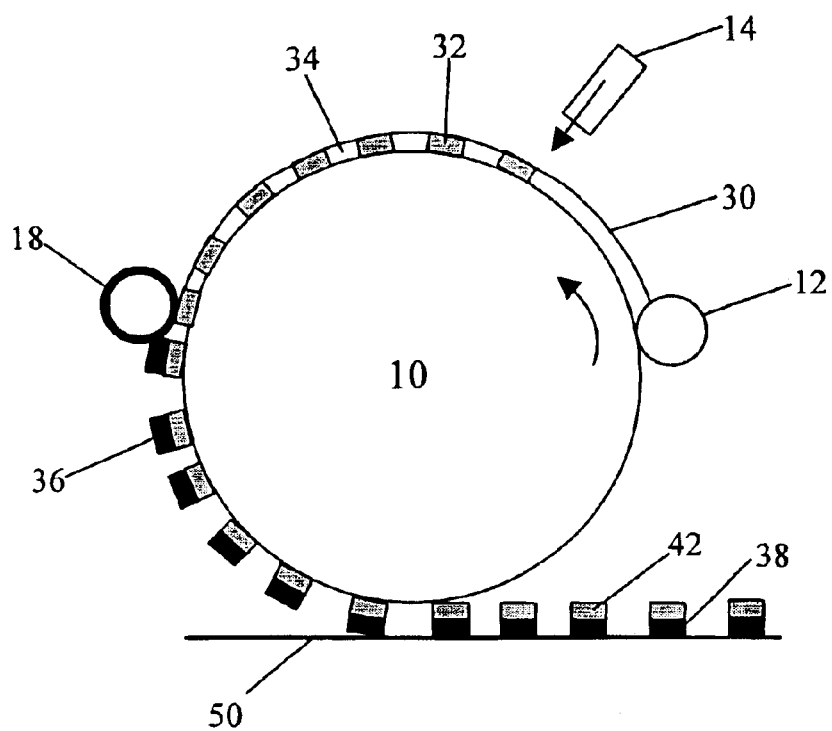
FIG. 5 is a diagrammatic cross-sectional view of a lithographic printing device of the invention wherein the hardened areas of the photosensitive layer transfer with ink to the receiving surface.

The printing device of this invention may be designed in a way so that the hardened photosensitive layer is capable of transferring with ink to the receiving surface. Such a printing device is illustrated in FIG. 5. In such a system, the erasing means may be omitted, although it is preferred to still have an erasing means in place in order to clean up any accidentally non-transferred photosensitive layer or to clean up the photosensitive layer when the printing device is running in idle (without printing to a receiving medium). Such a system may be achieved through certain modification of the printing system. It may be achieved by designing the photosensitive layer, the ink, the cylinder surface, and/or the receiving surface in a way so that the adhesion between the hardened photosensitive layer and the substrate is less than the adhesion between the hardened photosensitive layer and the receiving surface. The adhesion of the ink to the receiving surface and/or to the hardened photosensitive layer may be modified during the printing process by radiation, heat, solvent evaporation, chemical reaction, pressure, and any other physical or chemical process. In order for the hardened photosensitive layer to transfer with the ink to the receiving medium, the adhesion between the hardened photosensitive layer and the cylinder surface should not be too strong. On the other hand, the adhesion can not be too week because poor adhesion will cause lift-off of the hardened areas of photosensitive layer during development and/or inking process. Preferably, the cylinder surface has a smooth or shallowly grained surface.

A radiation curable ink that gives increased adhesion to the hardened photosensitive layer and/or the receiving surface upon exposure to a radiation can be used. A light source, preferably a lamp, may be installed in the printing device to irradiate the ink to cause partial or full curing before or during the transfer of the ink to the receiving medium. The light source can be installed between the inking means and the transfer point of the ink to the receiving surface; a deflector may be used to prevent the light from reaching the inking means. Alternatively, the light source can be installed after the transfer point of the ink to the receiving surface and exposes the ink on the transfer point.

A heat-sensitive ink which gives increased adhesion to the hardened photosensitive layer and/or the receiving surface upon heating can also be used. The increase in adhesion upon heating may be caused by chemical changes (such as thermal curing) or physical changes (such as thermal flow). A hot roller may be used to heat the ink by pressing the receiving medium against the cylinder surface. Alternatively, hot air or radiation may be used to heat the ink.

Figure 6:
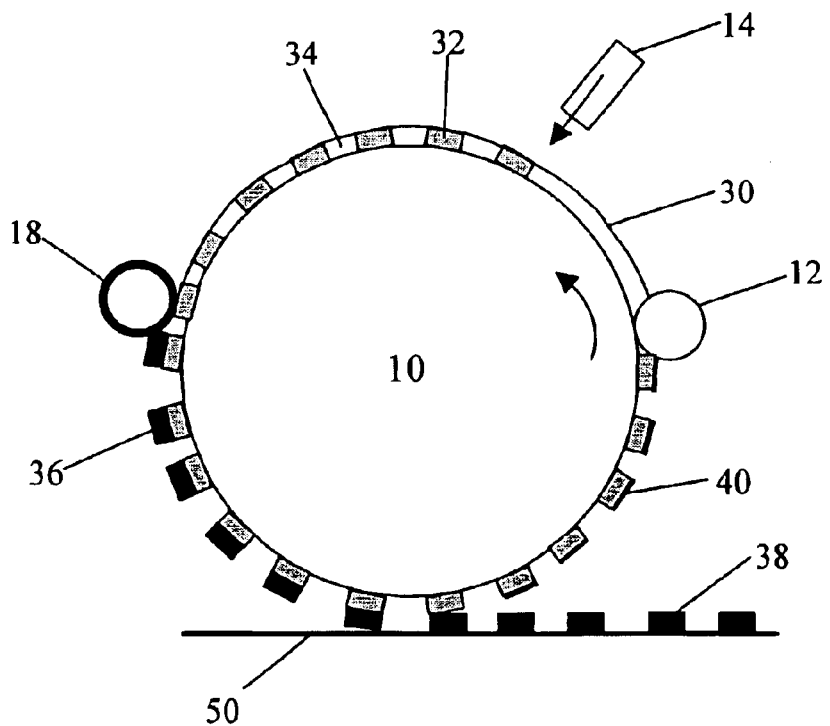
FIG. 6 is a diagrammatic cross-sectional view of a lithographic printing device of the invention wherein the hardened photosensitive layer and leftover ink are dissolved or dispersed in the coating fluid from the coating means.

The printing device of this invention may be designed in a way so that the hardened photosensitive layer and leftover ink 40 can be dispersed or dissolved in the photosensitive layer coating fluid from the coating means 12, as illustrated in FIG. 6. In such a system, the erasing means can be omitted. The photosensitive layer coating fluid should be designed to be robust enough so that the dispersion or dissolution of the hardened photosensitive layer and leftover ink in the coating fluid does not significantly interfere with the performance of the photosensitive layer. The ink should be designed to be compatible with the coating fluid so that the leftover ink does not interfere with the performance of the photosensitive layer. A photohardenable ink with photosensitivity similar to or even higher than that of the photosensitive layer can be used to minimize the interference of the hardened photosensitive layer and leftover ink to the photosensitive layer. For a wet lithographic printing process, the photosensitive ink and the photosensitive layer can be formulated to have the same or substantially the same composition; pigment or dye can be added to the photosensitive layer. The photosensitive layer should be only partially hardened by the exposure means so that the hardened photosensitive layer becomes insoluble or non-dispersible in ink and/or fountain solution but remains soluble or dispersible in the coating fluid. The coating fluid should be designed to have more dissolving power than the ink and/or fountain solution. The coating means may be designed to be able to dissolve or disperse and then mix the hardened photosensitive layer and leftover ink with the coating fluid. For example, one or more rollers may be used to perform dissolution or dispersion and mixing actions; preferably, two or more rollers are used. The hardened photosensitive layer and leftover ink may mix with small amount of coating fluid that is being applied, or large amount of coating fluid, or even the whole reservoir of coating fluid in the coating means. The photosensitive layer coating fluid can be a solventless liquid material, or can be a solution or dispersion with addition of solvent.

Figure 7:
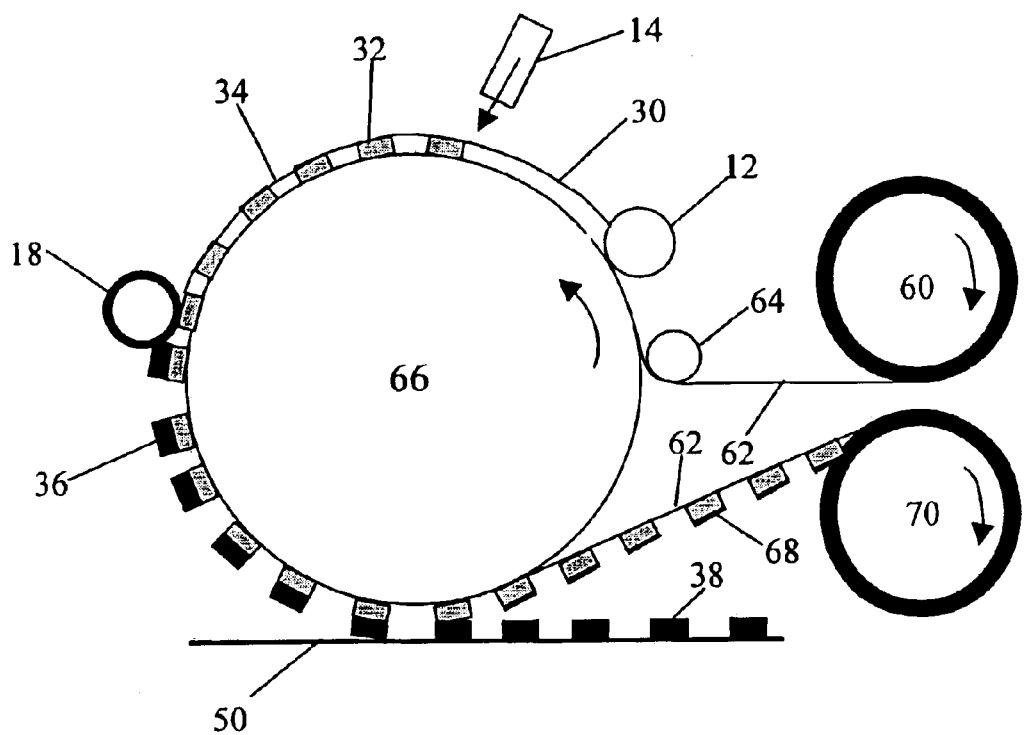
FIG. 7 is a diagrammatic cross-sectional view of a lithographic printing device of the invention utilizing a ribbon to form the lithographic substrate surface.

The lithographic printing device of this invention utilizing a substrate ribbon supply means is illustrated in FIG. 7. The lithographic printing device comprises (i) a substrate ribbon supply means for passing a ribbon 62 having a lithographic substrate surface through one or more rollers 64 (or cylinders 66) with one end unwinding from a roll of unused ribbon 60 and the other end winding up to a roll of used ribbon 70, (ii) a coating means 12 capable of depositing a photosensitive layer, (iii) an exposure means 14, and (iv) an inking means 18 capable of delivering ink or both fountain solution and ink. Here the term roller includes both roller and cylinder. Optionally, a transfer means 20 (not shown here) capable of transferring the inked imaging to the receiving surface can be installed after the inking means. Such a device requires an ink and/or fountain solution developable photosensitive layer. For a photosensitive layer not developable with ink and/or fountain solution, a developing means 16 (not shown here) may be installed between the exposure means and the inking means. The means 12, 14, 16, 18, and 20 are mounted proximate the ribbon and sequentially arranged along the moving direction of the ribbon; and each means of 12, 14, 16, 18, and 20 completes its designed function (such as coating, imaging, developing, inking, or transfer) to the ribbon surface areas at the designed printing width which pass by that means in each single pass during printing operation.

Figure 8:
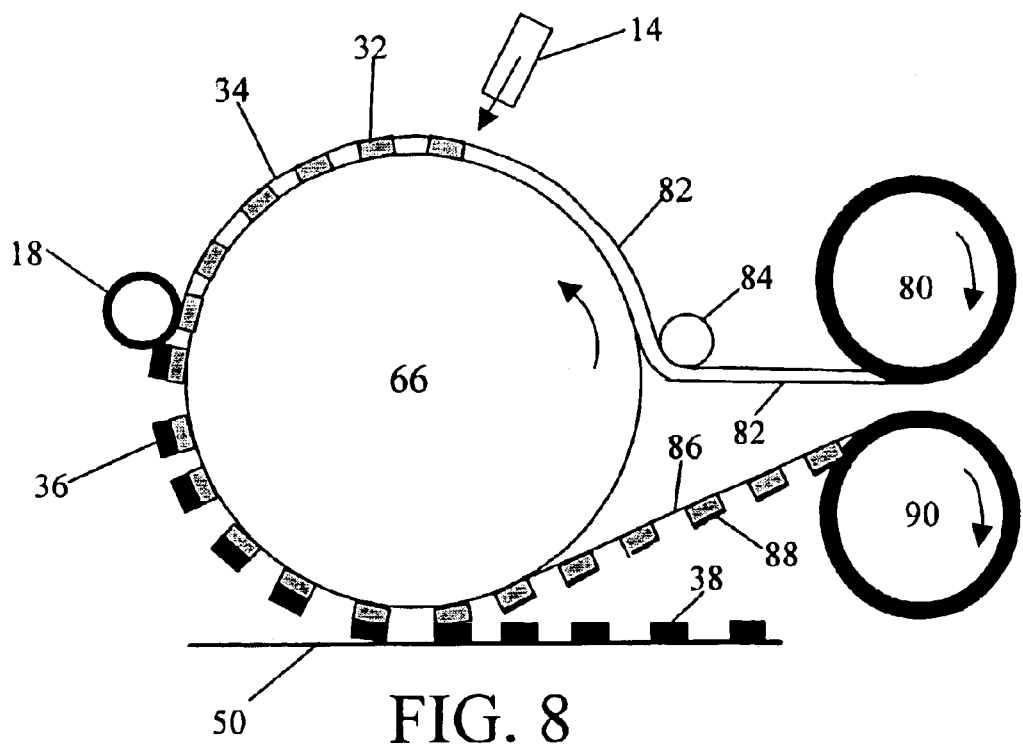
FIG. 8 is a diagrammatic cross-sectional view of a lithographic printing device of the invention utilizing a pre-sensitized lithographic ribbon.

The lithographic printing device of this invention utilizing a pre-sensitized lithographic ribbon is illustrated in FIG. 8. The lithographic printing device comprises (i) a pre-sensitized lithographic ribbon supply means for passing a pre-sensitized lithographic ribbon 82 through one or more rollers 84 (or cylinders 66) with one end unwinding from a roll of unused ribbon 80 and the other end winding up to a roll of used ribbon 90, said ribbon comprising on a substrate a photosensitive layer, (ii) an exposure means 14, and (iii) an inking means 18 capable of delivering ink or both fountain solution and ink. Optionally, a transfer means 20 (not shown here) capable of transferring the inked imaging to the receiving surface can be equipped after the inking means. Such a device requires pre-sensitized ribbon with an ink and/or fountain solution developable photosensitive layer. For a ribbon with a photosensitive layer not developable with ink and/or fountain solution, a developing means 16 (not shown here) may be installed between the exposure means and the inking means. The means 14, 16, 18, and 20 are mounted proximate the ribbon and sequentially arranged along the moving direction of the ribbon; and each means of 14, 16, 18, and 20 completes its designed function (such as imaging, developing, inking, or transfer) to the ribbon surface areas at the designed printing width which pass by that means in each single pass during printing operation. The printing device as shown in FIG. 8 can be a regular printer with the receiving medium passing through the printing device, or can be a printing wheel with the printing device moving against a the receiving surface of a stationary object. A small roller may be used to guide and press the inked ribbon against the receiving surface, allowing the printing of some hard-to-reach surfaces.

The ribbon substrate as used in the printing devices of FIGS. 7 and 8 can be any sheet-like material that has a suitable lithographic substrate surface and is durable and flexible enough to undergo the unwinding and winding process. It can be a polymeric film, a paper, or a metal with or without further surface treatment such as roughening, chemical treatment, or surface coating.

The photosensitive layer on the ribbon can be any photosensitive layer capable of hardening upon exposure to an actinic radiation. For ink and/or fountain solution developable ribbon, the photosensitive layer is soluble or dispersible in and quickly developable with ink and/or fountain solution. All the photosensitive layer compositions as described above can be used to coat the photosensitive layer on the substrate ribbon of FIG. 7 from a coating means. All the solid and semisolid photosensitive layer compositions as described above can be used for the photosensitive layer of the pre-sensitized ribbon as in FIG. 8.

An interlayer between the photosensitive layer and the ribbon substrate can be used to, for example, enhance the development process. An overcoat on the photosensitive layer of a ribbon can be used to, for example, to reduce oxygen inhibition. A release coating can be coated on the back of the ribbon to prevent blocking of the photosensitive layer to the back of the ribbon.

The exposure means, developing means, inking means, and transfer means as described above for the printing device utilizing a lithographic cylinder can be used for the printing device utilizing a lithographic ribbon. One or more rollers are generally provided to support the ribbon from the back, especially in the ink transfer areas.

The photosensitive layer should exhibit an affinity or aversion substantially opposite to the affinity or aversion of the substrate to at least one printing liquid selected from the group consisting of ink and an abhesive fluid for ink; the substrate can be the cylinder or ribbon surface on which the photosensitive layer is coated. Abhesive fluid for ink is a fluid that repels ink; fountain solution (comprising primarily water) is a commonly used abhesive fluid for typical ink (Typical ink is oleophilic.) for lithographic printing. For wet lithographic printing using both fountain solution and ink, the photosensitive layer and the substrate can be hydrophilic and oleophilic respectively, or oleophilic and hydrophilic respectively. For waterless lithographic printing utilizing only ink, the photosensitive layer and the substrate can be oleophilic and oleophobic respectively, or olephobic and oleophilic respectively. An oleophilic ink (a typical ink) will selectively form inked imaging in the oleophilic areas, and a hydrophilic ink will selectively form inked imaging in the hydrophilic areas during inking process. The ink-receptive areas can be the photosensitive layer surface in the hardened areas or the substrate surface corresponding to the non-hardened areas of the photosensitive layer, depending on the surface properties of the photosensitive layer, the substrate, and the ink.

The lithographic printing device of this invention can be a single color device or multicolor device. A single color printing device capable of printing only a single ink consists of one basic printing device (a printing cylinder together with all the means around it) as described above. A multi-color printing device capable of printing two or more colors consists of two or more basic printing devices as described above; each basic printing device prints different ink to the same receiving surface.

This invention is further illustrated by the following non-limiting examples of its practice.

EXAMPLE 1

This example uses a series of experimental steps to illustrate the feasibility of the variable data lithographic printing device and process of the present invention.

An anodized and silicate treated aluminum sheet was wrapped on the cylindrical surface of a cylindrical metal container having a diameter of about 20 cm and a length of about 40 cm, and was secured with double sided tapes. The treated side of the aluminum sheet faces outside and forms the lithographic printing cylinder surface of this invention.

Photosensitive layer fluid PS-1 was applied to the printing cylinder surface using a #3 Mayer rod to form a coating which covers the full length of the cylinder surface and a width of about 10 cm along the rotating direction of the cylinder surface. The coating was dried with a hot air blow drier for about 10 seconds to remove the solvent. The dried coating has a coating weight of about 0.5 g/m$^2$.

| PS-1 | |
| --- | --- |
| Component | Weight (g) |
| Ebecryl RX-8301 (Oligomer from UCB Chemicals) | 1.628 |
| Sartomer SR-399 (Monomer from Sartomer Company) | 6.513 |
| Pluronic L43 (Nonionic surfactant from BASF) | 0.830 |
| Irganox 1035 (Antioxidant from Ciba-Geigy) | 0.010 |
| Triazine PP (Free radical initiator from Panchim) | 1.018 |
| Acetone | 90.000 |

The photosensitive layer coated cylinder surface was exposed through a negative mask with an ultraviolet light from a 1000 watts mercury halide lamp at a distance of about 4 inches for about 5 sec. The exposed cylinder surface was pressed once with a cloth soaked with both fountain solution and ink. Good inked imaging in the exposed areas and clean background in the non-exposed areas were observed. The inked cylinder surface was then pressed against a sheet of paper. Good inked imaging was transferred to the paper.

The inked cylinder surface was then wiped with a cloth soaked with acetone to remove the hardened photosensitive layer as well as the leftover ink. The same cylinder surface area was repeated with the above coating, exposure, and inking processes; and good inked imaging was formed on the cylinder surface. The inked imaging was then pressed against a different part of the same sheet of paper used in the first printing cycle, and good inked imaging was transferred to the paper.

EXAMPLE 2

This example is the same as EXAMPLE 1 except that the combined inking and dampening process was replaced with separate dampening and inking process.

The exposed cylinder surface coated with photosensitive layer as above was wiped once with a cloth soaked with fountain solution, and then wiped once with a cloth soaked with ink. Good inked imaging in the exposed areas and clean background in the non-exposed areas were observed. The inked cylinder surface was then pressed against a sheet of paper. Good inked imaging was transferred to the paper.

I claim:

1. A variable data lithographic printing device comprising:
   (a) a substrate ribbon supply means for passing a substrate ribbon through one or more rollers with one end unwinding from a roll of unused ribbon and the other end winding up to a roll of used ribbon, said ribbon having a lithographic substrate surface;
   (b) a coating means for depositing a photosensitive layer on the substrate ribbon surface; wherein said photosensitive layer is capable of hardening upon exposure to an actinic radiation and exhibits an affinity or aversion substantially opposite to the affinity or aversion of said ribbon surface to at least one printing liquid selected from the group consisting of ink and an abhesive fluid for ink;
   (c) an exposure means for exposing the photosensitive layer on the ribbon with the actinic radiation according to digital imaging information to form hardened areas in the exposed areas and non-hardened areas in the non-exposed areas;
   (d) an inking means for applying ink or both fountain solution and ink to the ribbon to form inked images;
   (e) wherein the means (b) to (d) are mounted proximate the passage of the ribbon and sequentially arranged along the moving direction of the ribbon; and each means of (b) to (d) completes its designed function to the ribbon surface areas in the designed printing width which pass by said means in each single pass during printing operation.

2. The printing device of claim 1 wherein said photosensitive layer is soluble or dispersible in ink and/or fountain solution and the non-hardened areas of said photosensitive layer are capable of being removed by contacting with ink and/or fountain solution from the inking means.

3. The printing device of claim 1 further including between the exposure means and the inking means a developing means for removing the non-hardened areas of the photosensitive layer.

4. The printing device of claim 1 further including after the inking means a transfer means for passing the receiving medium through the printing device while pressing a receiving medium against the inked ribbon to transfer the inked images onto the receiving medium.

5. The printing device of claim 1 is a printing wheel wherein the printing device moves against a receiving surface of a stationary object during printing operation to transfer the inked images onto the receiving surface.

6. The printing device of claim 1 wherein said substrate is hydrophilic and said photosensitive layer is oleophilic, and said inking means supplies both fountain solution and ink.

7. The printing device of claim 1 wherein said substrate is oleophobic and said photosensitive layer is oleophilic, and said inking means supplies ink.

8. A variable data lithographic printing device comprising:
   (a) A pre-sensitized lithographic ribbon supply means for passing a pre-sensitized lithographic ribbon through one or more rollers with one end unwinding from a roll of unused ribbon and the other end winding up to a roll of used ribbon, said ribbon comprising on a substrate a photosensitive layer wherein said photosensitive layer is capable of hardening upon exposure to an actinic radiation and exhibits an affinity or aversion substantially opposite to the affinity or aversion of said substrate surface to at least one printing liquid selected from the group consisting of ink and an abhesive fluid for ink;
   (b) an exposure means for exposing the photosensitive layer of the ribbon with the actinic radiation according to digital imaging information to form hardened areas in the exposed areas and non-hardened areas in the non-exposed areas;
   (c) an inking means for applying ink or both fountain solution and ink to the ribbon to form inked images;
   (d) wherein the means (b) to (c) are mounted proximate the passage of the ribbon and sequentially arranged along the moving direction of the ribbon; and each means of (b) to (c) completes its designed function to the ribbon surface areas in the designed printing width which pass by said means in each single pass during printing operation.

9. The printing device of claim 8 wherein said photosensitive layer is soluble or dispersible in ink and/or fountain solution and the non-hardened areas of said photosensitive layer are capable of being removed by contacting with ink and/or fountain solution from the inking means.

10. The printing device of claim 8 further including between the exposure means and the inking means a developing means for removing the non-hardened areas of the photosensitive layer.

11. The printing device of claim 8 further including after the inking means a transfer means for passing a receiving medium through the printing device while pressing the receiving medium against the inked ribbon to transfer the inked images onto the receiving medium.

12. The printing device of claim 8 is a printing wheel wherein the printing device moves against a receiving surface of a stationary object during printing operation to transfer the inked images onto the receiving surface.

13. The printing device of claim 8 wherein said substrate is hydrophilic and said photosensitive layer is oleophilic, and said inking means supplies both fountain solution and ink.

14. The printing device of claim 8 wherein said substrate is oleophobic and said photosensitive layer is oleophilic, and said inking means supplies ink.

15. A variable data lithographic printing device comprising:
   (a) A pre-sensitized lithographic ribbon supply means for passing a pre-sensitized lithographic ribbon through one or more rollers with one end unwinding from a roll of unused ribbon and the other end winding up to a roll of used ribbon, said ribbon comprising on a hydrophilic substrate an oleophilic photosensitive layer wherein said photosensitive layer is soluble or dispersible in ink and/or fountain solution and capable of hardening upon exposure to an actinic radiation;
   (b) an exposure means for exposing the photosensitive layer of the ribbon with the actinic radiation according to digital imaging information to form hardened areas in the exposed areas and non-hardened areas in the non-exposed areas;
   (c) an inking means for applying fountain solution and ink to the ribbon to remove the non-hardened areas of the photosensitive layer and to form inked images in the hardened areas;
   (d) wherein the means (b) to (c) are mounted proximate the passage of the ribbon and sequentially arranged along the moving direction of the ribbon; and each means of (b) to (c) completes its designed function to the ribbon surface areas in the designed printing width which pass by said means in each single pass during printing operation.

16. The printing device of claim 15 further including after the inking means a transfer means for passing the receiving medium through the printing device while pressing the receiving medium against the inked ribbon to transfer the inked images onto the receiving medium.

17. The printing device of claim 15 is a printing wheel wherein the printing device or the ribbon surface moves against the receiving surface of a stationary object during printing operation to transfer the inked images onto the receiving surface.

18. The printing device of claim 15 wherein said actinic radiation is an infrared, visible or ultraviolet laser.

19. The printing device of claim 15 wherein said photosensitive layer comprises a polymerizable monomer and an initiator.

20. The printing device of claim 15 wherein said photosensitive layer comprises a polymerizable monomer, an initiator, and an actinic light absorbing dye.

21. The printing device of claim 15 wherein said ribbon further comprises an ink and/or fountain solution soluble or dispersible interlayer between the substrate and the photosensitive layer.

22. The printing device of claim 15 wherein said ribbon further comprises an ink and/or fountain solution soluble or dispersible overcoat on the photosensitive layer.

* * * * *